(12) United States Patent
Fujimori

(10) Patent No.: US 6,385,076 B1
(45) Date of Patent: May 7, 2002

(54) NONVOLATILE MEMORY AND ITS DRIVING METHOD

(75) Inventor: Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/686,975

(22) Filed: Oct. 12, 2000

(30) Foreign Application Priority Data

Oct. 13, 1999 (JP) ............................................. 11-291337
Oct. 13, 1999 (JP) ............................................. 11-291338

(51) Int. Cl.$^7$ ................................................. G11C 7/00
(52) U.S. Cl. .................... 365/145; 365/65; 365/185.05; 365/117; 365/185.14
(58) Field of Search ................................ 365/145, 149, 365/65, 185.01, 185.05, 117, 185.14

(56) References Cited

U.S. PATENT DOCUMENTS

| | | | |
|---|---|---|---|
| 5,515,311 A | | 5/1996 | Mihara ........................ 365/145 |
| 5,559,733 A | * | 9/1996 | McMillan et al. ........... 365/145 |
| 5,708,284 A | | 1/1998 | Onishi ......................... 257/295 |
| 5,753,946 A | * | 5/1998 | Naiki .......................... 257/295 |
| 5,821,005 A | * | 10/1998 | Kijima et al. ................ 428/701 |
| 5,856,688 A | | 1/1999 | Lee et al. .................... 257/295 |
| 5,959,879 A | * | 9/1999 | Koo ............................. 365/145 |
| 5,986,301 A | * | 11/1999 | Fukushima et al. ......... 257/306 |
| 6,048,738 A | * | 4/2000 | Hsu et al. ........................ 438/3 |
| 6,054,734 A | * | 4/2000 | Aozasa et al. ............... 257/315 |
| 6,084,260 A | * | 7/2000 | Hirai et al. .................. 257/295 |
| 6,094,369 A | * | 7/2000 | Ozawa et al. ............... 365/145 |
| 6,141,238 A | * | 10/2000 | Forbes et al. ............... 365/145 |
| 6,191,441 B1 | * | 2/2001 | Aoki et al. .................. 257/295 |
| 6,191,463 B1 | * | 2/2001 | Mitani et al. ............... 257/411 |
| 6,194,752 B1 | * | 2/2001 | Ogasahara et al. ......... 257/295 |
| 6,233,169 B1 | * | 5/2001 | Nishimura .................. 365/145 |

FOREIGN PATENT DOCUMENTS

| | | |
|---|---|---|
| EP | 1 031 989 | 8/2000 |
| JP | 4-171978 | * 4/1992 |
| JP | 04-171978 | 6/1992 |
| JP | 8-097386 | 4/1996 |
| JP | 8-264665 | 10/1996 |

* cited by examiner

*Primary Examiner*—Viet Q. Nguyen
(74) *Attorney, Agent, or Firm*—Morgan, Lewis & Bockius LLP

(57) ABSTRACT

A nonvolatile memory in which transistors having MFMIS structure each of which is composed by sequentially laminating a floating-gate, a ferroelectric layer and a control gate via a gate insulating film on the surface of a semiconductor substrate between a source area and a drain area formed on the semiconductor substrate are arrayed in a matrix, wherein the control gate is connected to a word line, said source area is connected to a source line and said drain area is connected to a drain line; a floating line composed of writing gates composed so that a capacitor is formed between the writing gate and said floating-gate is provided; a word line and a source line on the same line in said matrix are connected in common; a drain line and a floating line in the same column in said matrix are connected in common; and source/drain voltage and gate voltage can be independently set.

6 Claims, 9 Drawing Sheets

|         | WL1 | WL2    | SL1 | SL2 | FL1 | FL2    | DL1 | DL2 |
|---------|-----|--------|-----|-----|-----|--------|-----|-----|
| Write (1) | Vcc | 1/3Vcc |     |     | 0   | 2/3Vcc |     |     |
| Write (0) | 0   | 2/3Vcc |     |     | Vcc | 1/3Vcc | 0   |     |
| Read    | Vr  | 0      | $V_{SA}$ |     | 0   |        |     |     |

NONVOLATILE MEMORY AND ITS DRIVING METHOD

BACKGROUND OF THE INVENTION

1. Field of the Invention

The present invention relates to a nonvolatile memory and its driving method, particularly relates to a nonvolatile memory that enables allowing a reading margin a sufficient value, in which disturbance in writing to a close cell is prevented and that is almost free of a malfunction.

2. Description of the Related Art

For a memory cell where each memory transistor having MFMIS structure which is an example of a semiconductor memory wherein data can be electrically written and data can be stored in a state of no power supply is arrayed in a matrix, 1T/2C memory cell structure composed by one selected transistor and two memory capacitors as shown in FIG. 10 for example is proposed. In this structure, each one electrode of the memory capacitors is connected, is connected to the gate electrode of the selected transistor and each other electrode of the memory capacitors is connected to the source and the drain of the selected transistor. Therefore, there is a problem that source/drain voltage $V_{SD}$ and gate voltage $V_G$ cannot be independently set.

In this semiconductor memory, the source of each memory cell on each line in a transverse direction is connected to be a bit line BL1, BL2, - - - and the drain of each memory cell arranged in each column in a longitudinal direction is connected to be a word line WL1, WL2, - - - .

For this memory cell structure, FET having MFMIS structure wherein a metallic layer (M) and an insulator layer (I) intervene between ferroelectrics and semiconductor as a buffer layer as shown in a sectional explanatory drawing in FIG. 11 is proposed. The FET having MFMIS structure is composed by sequentially laminating a gate oxide film 3, a floating-gate 4, a ferroelectric film 5 and a control gate 6 on a channel area formed between source area S and a drain area D of a semiconductor substrate 1.

In this structure, normally, when the semiconductor substrate 1 is installed and positive voltage is applied to the control gate 6 as shown in FIG. 12A, polarization occurs in the ferroelectric film 5. Even if the voltage applied to the control gate 6 is removed, negative charge is generated in a channel formation area by remanent polarization of the ferroelectric film 5. This shall be a state of 1.

Conversely, when negative voltage is applied to the control gate 6, polarization in a reverse direction occurs in the ferroelectric film 5. Even if the voltage applied to the control gate 6 is removed, positive charge is generated in the channel formation area by remanent polarization of the ferroelectric film 5. This shall be a state of 0. As described above, information '1' or '0' can be written to FET. FIGS. 12A and 12B respectively show a state in which information '1' and '0' is written.

Written information is read by applying reading voltage $V_r$ to the control gate. The reading voltage $V_r$ is set to a value between threshold voltage $V_{th1}$ in a state of 1 and threshold voltage $V_{th0}$ in a state of 0. It can be discriminated whether written information is 1 or 0 by detecting whether drain current flows or not when reading voltage $V_r$ is applied to the control gate 6.

As described above, according to FET having MFMIS structure, one memory cell can be composed of one device and non-destructive reading can be satisfactorily performed. Therefore, both can be identified.

However, in case the capacity $C_{f1}$ and $C_{f2}$ of memory capacitors are sufficiently larger than the capacity $C_{OX}$ depending upon a gate insulating film, gate voltage $V_G$ normally becomes a half of $V_{SD}$, relationship between drain current $I_D$ and source/drain voltage $V_{SD}$ in writing '1' and in writing '0' are respectively as shown in FIGS. 12A and 12B and in reading, intermediate voltage is required to be set so that these values can be identified. Therefore, as shown in FIG. 13, in case reading voltage $V_r$ is set to a value between the minimum level in writing '1' and the maximum level in writing '0', there is a problem that a reading margin between 1 and 0 is small. Therefore, in the case of a cell to which '0' is written, a coercive electric field may be also exceeded, it is judged that '1' is written to a cell to which '0' should be written and the reverse case occurs.

A nonvolatile memory wherein reliable reading characteristics can be acquired by allowing a reading margin a large value without causing wrong reading is desired.

There is a memory in which memory transistors having such MFMIS structure are arrayed in a matrix. Above all, a memory which is an example of a semiconductor memory in which data can be electrically written and which can store data in a state of no power supply wherein memory transistors having MFMIS structure are arrayed in a matrix is composed by composing one memory cell by one memory transistor and arraying memory cells lengthwise and crosswise as shown in FIG. 14 for example. In this semiconductor memory, the source of each memory cell on each line in a transverse direction is connected to be a source line SL1, SL2, - - - , the drain of each memory cell arranged in each column in a longitudinal direction is connected to be a drain line DL1, DL2, - - - , substrate potential is connected to be a back gate line BL1, BL2, - - - and the control gate of each memory cell arranged on each line in the transverse direction is connected to be a word line WL1, WL2, - - - , WLn.

As for the structure of the memory cell, as shown in sectional explanatory drawings in FIGS. 15A and 15B, FET having MFMIS structure in which a metallic layer (M) and an insulator layer (I) intervene between ferroelectrics and semiconductor as a buffer layer is proposed. The FET having MFMIS structure is composed by sequentially laminating a gate oxide film 105, a floating-gate 106, a ferroelectric film 107 and a control gate 108 on a channel area 104 formed between a source area 102 and a drain area 103 on a semiconductor substrate 101.

In this structure, normally, when the semiconductor substrate 101 is installed and positive voltage is applied to the control gate 108 as shown in FIG. 15A, polarization occurs in the ferroelectric film 107. Even if the voltage applied to the control gate 108 is removed, negative charge is generated in a channel formation area CH by remanent polarization of the ferroelectric film 107.

This shall be a state of 1.

Conversely, when negative voltage is applied to the control gate 108, polarization occurs in the reverse direction in the ferroelectric film 108. Even if the voltage applied to the control gate 108 is removed, positive charge is generated in the channel formation area CH by remanent polarization of the ferroelectric film 108. This shall be a state of 0.

As described above, information '1' or '0' can be written to FET.

Reading written information is executed by applying reading voltage $V_r$ to the control gate. The reading voltage $V_r$ is set to a value between threshold voltage $V_{th1}$ in a state of 1 and threshold voltage $V_{th0}$ in a state of 0. It can be discriminated by detecting whether drain current flows or not when the reading voltage $V_r$ is applied to the control gate 108 whether written information is 1 or 0.

As described above, according to the FET having MFMIS structure, one memory cell can be composed by one device and non-destructive reading can be satisfactorily performed.

However, when a selected cell is set to a writing state as described above in writing data to the selected cell, an adjacent cell on the same line shares the source line SL and the word line WL of the corresponding cell and an adjacent cell in the same column shares the back gate line BL and the drain line DL. Therefore, also in an unselected cell, $V_F = V_C$ to ⅓ of $V_C$, a coercive electric field may be exceeded, writing is executed to a cell to be not written and the reverse case occurs.

Then, the provision of a nonvolatile memory wherein reliable writing characteristics can be acquired without causing wrong reading in a memory cell array is desired.

SUMMARY OF THE INVENTION

A first aspect of the invention provides a nonvolatile memory wherein reliable reading characteristics can be acquired without causing wrong reading by allowing a reading margin a large value.

A second aspect of the invention provides a nonvolatile memory wherein reliable writing characteristics can be acquired without causing wrong writing in a memory cell array.

The first aspect of the invention is characterized in that a control gate is connected to a word line, a source area is connected to a source line, a drain area is connected to a drain line, a floating line composed of writing gates and composed so that a capacitor is formed between the floating line and the floating-gate is provided, the word line and the source line on the same line in a matrix are connected in common, the drain line and the floating line in the same column in the matrix are connected in common and source/drain voltage and gate voltage can be independently set in a nonvolatile memory wherein transistors having MFMIS structure composed by sequentially laminating a floating-gate, a ferroelectric layer and a control gate via a gate insulating film on the surface between a source area and a drain area respectively formed on a semiconductor substrate are arrayed in the matrix.

Also, the second aspect of the invention is characterized in that one memory cell composes FET having MFMIS structure acquired by sequentially laminating a floating-gate, a ferroelectric layer and a control gate via a gate insulating film on the surface between a source area and a drain area respectively formed on a semiconductor substrate, the floating-gate is extended on an element isolation insulating film, the floating-gate is provided with a capacitor insulating film between the floating-gate and a writing gate formed on the element isolation insulating film and composes a capacitor.

As in such an MFMIS transistor, source/drain voltage and gate voltage can be independently set, a nonvolatile memory wherein a reading margin can be allowed a large value as current/voltage characteristics in FIG. 4 show, wrong reading is reduced and high reliability is acquired can be provided.

Also, as the capacitor is composed by the floating-gate extended on the element isolation insulating film in addition to the effect described above in the second aspect of the invention, the structure described above can be realized without increasing the area of one cell.

Also, a third aspect of the invention is characterized in that a gate electrode is connected to a word line, a source area is connected to a source line, a drain area is connected to a drain line, a semiconductor substrate is composed so that it is isolated every column and voltage can be independently applied, is connected to a back gate line so that source line potential and drain line potential can be respectively set to floating potential or ground potential every line and column, a depletion layer spreads in the channel area of a ferroelectric transistor composing an unselected cell in the vicinity of a selected cell by keeping the source/drain potential a desired value and an inversion layer is prevented from being formed when data is written to the selected cell in a nonvolatile memory wherein ferroelectric transistors composed by laminating a gate electrode via at least a first ferroelectric layer on the surface between a source area and a drain area respectively formed on a semiconductor substrate are arrayed in the matrix.

A fourth aspect of the invention is characterized in that a depletion layer spreads in the channel area of a ferroelectric transistor in an unselected cell by making one of the source and the drain of a selected cell ground potential, making the source/drain potential of an unselected cell on at least an adjacent line of the selected cell floating and keeping the source/drain potential a desired value and drain current is prevented when data is written of the selected cell in a nonvolatile memory wherein ferroelectric transistors composed by laminating a gate electrode via at least a first ferroelectric layer on the surface between a source area and a drain area respectively formed on a semiconductor substrate are arrayed in the matrix, the gate electrode is connected to a word line, the source area is connected to a source line, the drain area is connected to a drain line, the semiconductor substrate is isolated every column so that voltage can be independently applied, is connected to a back gate line and source line potential and drain line potential can be respectively set to floating potential or ground potential every line and column.

In such an MFMIS transistor, as an equivalent circuit diagram in FIG. 16 shows, a capacitor $C_f$ depending upon the ferroelectric film 7, a capacitor $C_{OX}$ depending upon the gate oxide film 5 and a capacitor $C_D$ depending upon the depletion layer are connected in series. Therefore, in case voltage V is applied between the substrate 1 and the control gate 8, the voltage is divided into $V_f$, $V_{OX}$ and $V_D$ as shown in the following expression (1).

$$V = V_F + V_{OX} + V_D$$

$$C_F V_F = C_{OX} V_{OX} = C_D V_D = q \tag{1}$$

q: Quantity of charge generated by capacitor

Therefore, potential voltage $V_f$ shown in the following expression is applied to the capacitor $C_f$ depending upon the ferroelectric film 7.

$$V_F = C_F C_{OX} C_D / (C_F C_{OX} + C_{OX} C_D + C_D C_F) \cdot V_G \tag{2}$$

Therefore, when the source and the drain are in a floating state, a depletion layer spreads as shown in FIG. 9A and the capacity $C_D$ of the depletion layer is increased. Therefore, voltage VF applied to the ferroelectrics is as follows and VF is reduced.

$$VF = \{C_F C_{OX} C_D / (C_F C_{OX} + C_{OX} C_D + C_D C_F)\} \cdot V_G \tag{A}$$

Therefore, when this state is used for an unselected cell, disturbance for the unselected cell is reduced.

In the meantime, as an electron is supplied from the source/drain areas to the channel area as shown in FIG. 9B and an inversion layer is generated when the source and the drain are grounded, voltage VF applied to the ferroelectrics is as follows.

$$VF=\{C_F C_{OX}/(C_F+C_{OX})\}\cdot V_G \quad (B)$$

Then, in the invention, for a selected cell which is a writing cell, sufficient voltage VF is applied to the ferroelectric film, while for an adjacent cell, the source and the drain are made floating, the depletion layer is made spread in the channel area of FET, voltage $V_F$ applied to the ferroelectrics is reduced by increasing the capacity of the depletion layer and wrong written is prevented so that a state shown in FIG. 9A is realized.

Concretely, for a cell having potential difference between the word line and the back gate line except a selected cell, its potential is set so that potential at the source equivalent to a line and at the drain equivalent to a column is prevented from being both zero, all unselected cells are made a state shown in FIG. 9B, voltage applied to the ferroelectrics is reduced by potential applied to the selected cell and disturbance is prevented.

DETAILED DESCRIPTION OF THE PREFERRED EMBODIMENTS

Figure 1:
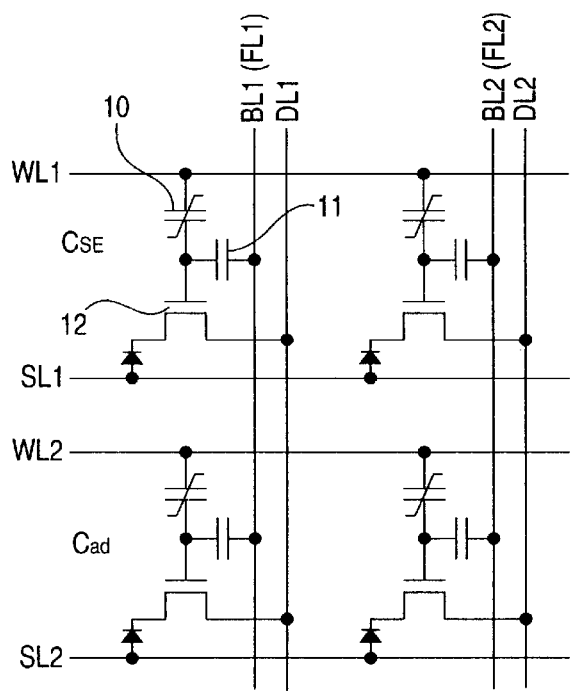
FIG. 1 shows an equivalent circuit of a nonvolatile memory equivalent to a first embodiment of the invention.

Next, referring to the drawings, a nonvolatile memory and its driving method according to the invention will be described.

In the nonvolatile memory according to the invention, as a circuit explanatory drawing in one embodiment is shown in FIG. 1, memory cells composed of memory transistors with MFMIS structure are arrayed in a matrix on a semiconductor substrate. The source of each memory cell on each line in a transverse direction is connected to be each source line SL1, SL2, - - - , the drain of each memory cell arranged on each line in a longitudinal direction is connected to be each drain line DL1, DL2, - - - respectively by composing one memory cell by one memory transistor and arraying memory cells lengthwise and crosswise, the electrode (a writing gate) of a capacitor formed under a floating-gate is arrayed in the direction of a column to be each floating line FL1, FL2, - - - and the control gate on each memory cell arranged on each line in the transverse direction is connected to be each word line WL1, WL2, - - - , WLn so that source/drain voltage and gate voltage can be independently set and a sufficient reading margin can be acquired.

For a column line in which the column of memory cells arranged in a longitudinal direction in FIG. 1 is selected, approximately 6 or 8 columns for example in this example are collectively selected and potential can be collectively set for data in the selected column. Each memory cell arranged in the longitudinal direction in FIG. 1 is composed so that the drain area of each transistor is connected, a drain line DL is formed, capacitor electrodes (writing gates) are connected, a floating line FL is formed and potential for data in the selected column can be collectively set.

In the meantime, each memory cell arranged in a transverse direction in FIG. 1 is composed so that the source area of each transistor is connected, a source line SL is formed, the control gate is connected, a word line WL is formed and potential for data on the selected line can be collectively set.

Figure 2A:
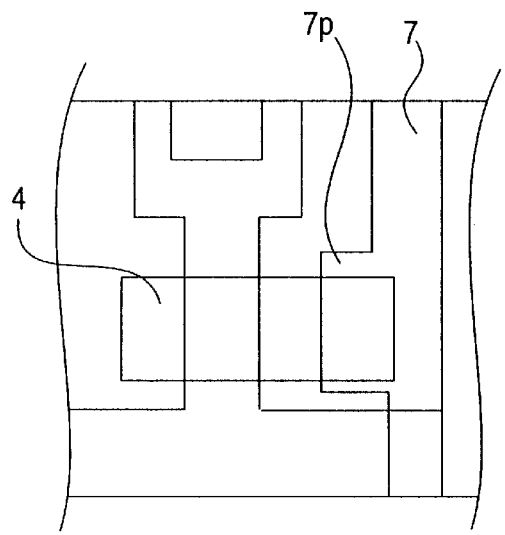
FIGS. 2A and 2B are top view and a sectional view showing the nonvolatile memory.
Figure 2B:
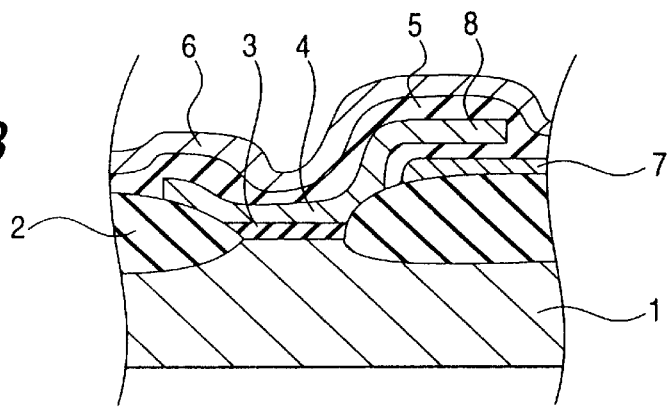

One cell unit of this memory cell is characterized as shown in FIGS. 2A and 2B in that in FET having MFMIS structure in which a floating-gate 4, a ferroelectric layer 5 and a control gate 6 are sequentially laminated via a gate insulating film 3 on the surface of a semiconductor substrate 1 between a source area and a drain area respectively formed on the surface of the semiconductor substrate, the floating-gate is extended on the element isolation insulating film, the floating-gate is provided with a capacitor insulating film 8 between the floating-gate and a capacitor electrode 7 formed on the element isolation insulating film and a capacitor is composed. That is, one cell unit is characterized in that the capacitor electrode 7 as the writing gate includes an area 7P protruded in the direction of the floating-gate in an area close to the floating-gate 4 and a capacitor is formed in an area in which the protruded area 7P and the floating-gate 4 are overlapped.

Figures 3, 4:
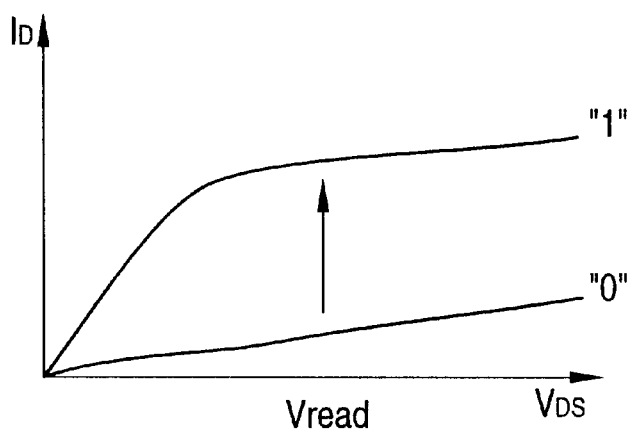
FIG. 3 shows voltage applied to each line of the nonvolatile memory.
FIG. 4 shows relationship between the source/drain voltage and the drain current of the nonvolatile memory.

According to such configuration, data is read by a normal method as in a conventional type, however, a reading margin between 1 and 0 can has a sufficient value as shown in FIG. 4 by setting potential in each line as shown in FIG. 3 and a memory almost free of a malfunction can be acquired.

That is, memory cells each of which is composed of a memory transistor 10, a capacitor 11 and a switching transistor 12 in MFMIS structure are arrayed on a semiconductor substrate in a matrix. One memory cell is composed of one memory transistor and memory cells are arrayed lengthwise and crosswise. As described above, the source of each memory cell on each line in a transverse direction is connected via a diode for preventing wrong reading to be a source line SL1, SL2, - - - by composing one memory cell by one memory transistor and arraying memory cells lengthwise and crosswise, the drain of each memory cell arranged in each column in a longitudinal direction is connected to be a drain line DL1, DL2, - - -, substrate potential is connected to be a back gate line BL1, BL2, - - - and the control gate of each memory cell arranged on each line in the transverse direction is connected to be a word line WL1, WL2, - - -.

Figure 5:
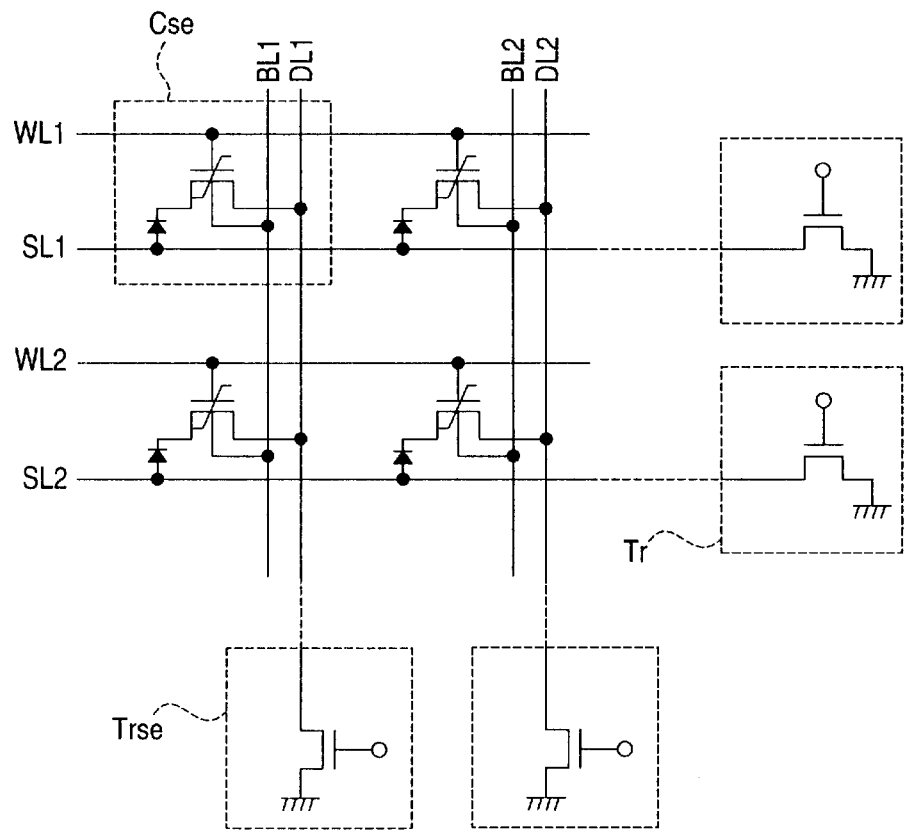
FIG. 5 shows an equivalent circuit of a nonvolatile memory equivalent to a second embodiment of the invention.

For a column line in which a column of memory cells arranged in a longitudinal direction in FIG. 5 is selected, approximately 6 or 8 columns for example are collectively selected in this example and potential can be collectively set for data in the selected column.

In the meantime, memory cells arranged in a transverse direction in FIG. 5 are composed so that the source area of each transistor is connected to be a source line SL, the floating-gate is connected to be a word line WL and potential can be collectively set for data on the selected line.

Next, a method of erasing the nonvolatile memory and a method of writing and reading data to/from the nonvolatile memory will be described. The level of potential is different depending upon a device, however, one example will be described below using an absolute value.

First, when writing (a state of 1) to a selected cell $C_{se}$ is executed, pulse voltage $V_{cc}$ at high potential is applied to a word line WL1 as shown in a table in FIG. 3, a source line SL1 is made open (floating), a drain line DL1 is grounded (0 V) and substrate potential BL1 (FL1) is made ground potential. One third (⅓) of $V_{cc}$ is applied to the word line WL2 of an adjacent cell, a drain line DL2 is made open (floating) and substrate potential BL2 is made ⅔ of $V_{cc}$.

In the meantime, when writing (a state of 0) to a selected cell $C_{se}$ is executed, the word line WL1 is grounded as shown in FIG. 3, the source line SL1 is made open (floating), the drain line DL1 is grounded (0 V) and substrate potential BL1 is made $V_{cc}$. Also, ⅔ of $V_{cc}$ is applied to the word line WL2 of the adjacent cell, the source line SL2 is made open (floating) and the drain line DL2 is made open (floating).

Also, to maintain the erased state of a memory cell except that in a source line to which a word line writes '0' in common, a source or drain line is made floating or $V_{cc}$. In the meantime, in case '1' is written, to maintain the erased state of a memory cell except that in a source line, a source or drain line except a source line for data to be written is made floating or ground potential.

Further, in reading, as shown in FIG. 3, when reference potential Vr is applied to the control gate of a transistor in the selected cell $C_{se}$, fixed voltage $V_{SA}$ is applied to a source line SL, the voltage is output as it is because current hardly flows as described above when data is '1', fixed voltage is detected and voltage drops to be low voltage because current flows as described above when data is '0'. Therefore, '1' and '0' can be identified and no malfunction is caused in an adjacent cell.

That is, for the selected cell which is the corresponding writing cell, sufficient voltage VF is applied to a ferroelectric film, while for an adjacent cell, applied voltage is reduced and a margin between 0 and 1 can be allowed a large value to prevent wrong writing.

In the embodiment described above, the case in which a memory transistor having MFMIS structure is used is described, however, the invention is not limited to the embodiment and it need scarcely be said that the invention can be also applied to a transistor having MFS structure.

As described above, according to the invention, a nonvolatile memory wherein wrong writing to an unselected cell in the vicinity of a selected cell is disabled and reliable writing is enabled can be acquired by enabling independently setting source/drain voltage and gate voltage.

In the embodiment described above, the ferroelectric memory having MFMIS structure is described, however, the invention is not limited to this, the capacitor insulating film formed between the floating-gate and the writing electrode is not required to be a ferroelectric film, may be also high-dielectric constant dielectrics or may be also normal dielectrics.

As described above, according to the nonvolatile memory according to the invention, source/drain voltage and gate voltage can be independently set so that a reading margin can be allowed a large value and reliable reading is enabled.

Next, referring to the drawings, a nonvolatile memory and its driving method equivalent to a second embodiment of the invention will be described.

In the nonvolatile memory according to the invention, memory cells each of which is composed of a memory transistor having MFMIS structure are arrayed on a semiconductor substrate in a matrix as shown in FIG. 5 which is the circuit explanatory drawing in the first embodiment. The source of each memory cell on each line in a transverse direction is connected via a diode for preventing wrong reading to be a source line SL1, SL2, - - -, the drain of memory cells arranged in each column in a longitudinal direction is connected to be a drain line DL1, DL2, - - -, substrate potential is connected to be a back gate line BL1, BL2, - - - and the control gate of each memory cell arranged on each line in the transverse direction is connected to be a word line WL1, WL2, - - - respectively by composing one memory cell by one memory transistor and arraying memory cells lengthwise and crosswise.

For a column line in which the column of memory cells arrayed in the longitudinal direction in FIG. 5 is selected, approximately 6 or 8 columns for example in this example are collectively selected and potential can collectively set for data in the selected column.

In the meantime, each memory cell arranged in the transverse direction in FIG. 5 is composed so that the source area of each transistor is connected to be a source line SL, the floating-gate is connected to be a word line WL and potential can be collectively set for data on the selected line.

Next, a method of erasing the nonvolatile memory shown in FIG. 5, writing and reading to/from it will be described. The level of potential is different depending upon a device, however, high potential means potential for potential difference between high potential and low potential (for example, the ground) to be voltage of approximately 3 to 5 V for example and means a relative value between it and low potential.

Figure 6:
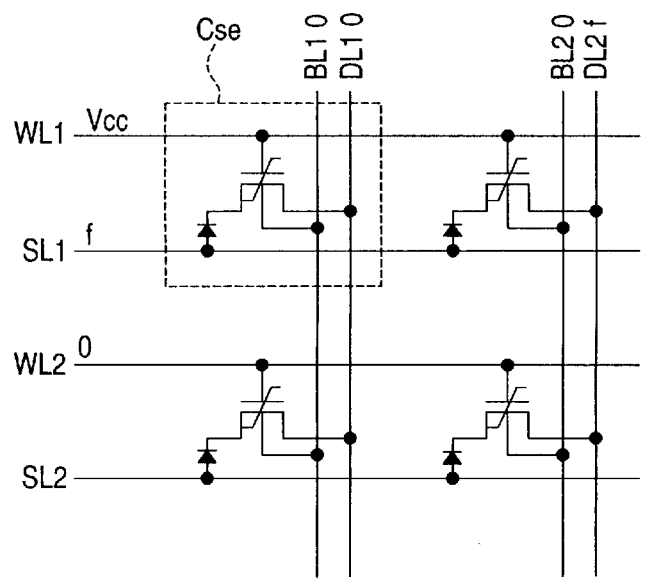
FIG. 6 shows a state of a signal in case writing ('1') is executed to a selected cell of the nonvolatile memory equivalent to the second embodiment of the invention.

First, when writing (a state of 1) to a selected cell $C_{se}$ is executed, pulse voltage $V_{cc}$ at high potential is applied to the word line WL1 as shown in FIG. 6, the source line SL1 is made open (floating), the drain line DL1 is grounded (0 V) and substrate potential BL1 is grounded. The word line WL2 of an adjacent cell is grounded, the drain line DL2 is made open (floating) and substrate potential BL1 is grounded.

The source and the drain of the adjacent cell may be also made $V_{cc}$ in place of making them floating.

Figure 7:
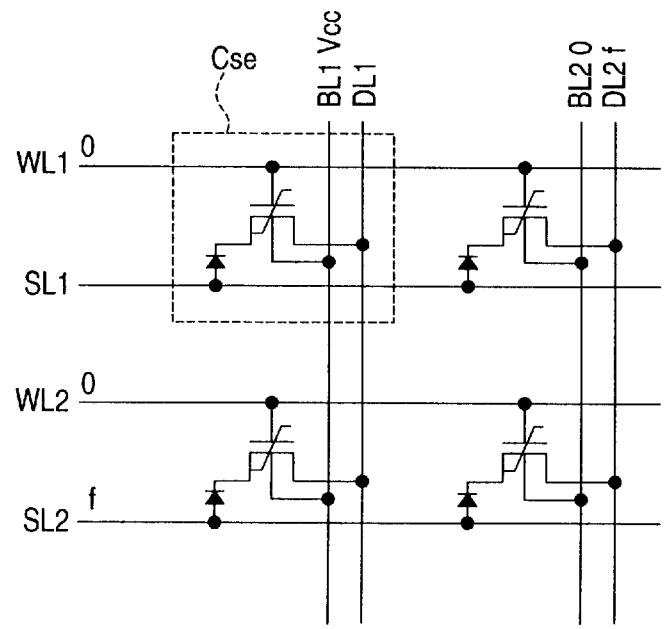
FIG. 7 shows a state of a signal in case writing ('0') is executed to a selected cell of the nonvolatile memory equivalent to second embodiment of the invention.

In the meantime, when writing (a state of 0) to the selected cell $C_{se}$ is executed, the word line WL1 is ground, the source line SL1 is made open (floating), the drain line DL1 is ground (0 V) and substrate potential BL1 is made $V_{cc}$ as shown in FIG. 7. Also, the word line WL2 of the adjacent cell is grounded, the source line SL2 is made open (floating) and the drain line DL2 is m a de open (floating).

The source and the drain of the adjacent cell may be also made $V_{cc}$ in place of making them floating.

To keep the erased state of a memory cell except the source line for '0' to be written in common from the word line, the source line or the drain line is made floating or $V_{cc}$. In the meantime, to keep the erased state of a memory cell except the source line in case '1' is written, the source line except a source line to be written or the drain line is made floating or $V_{cc}$.

Figure 8:
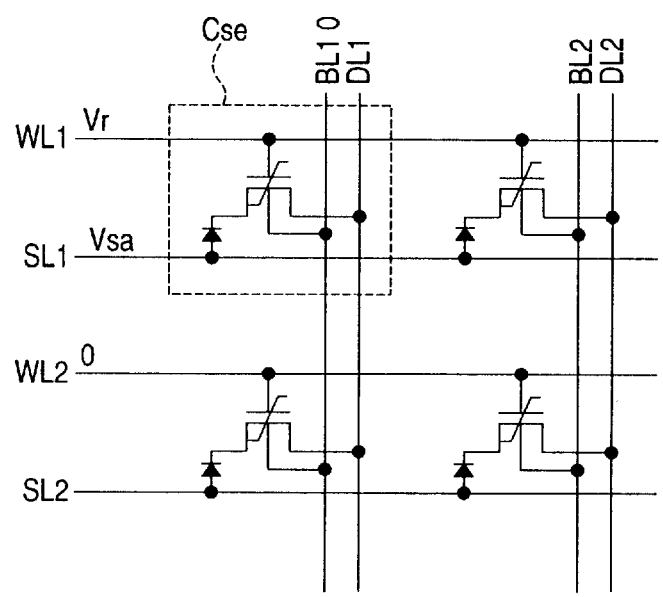
FIG. 8 shows a state of a signal in case reading is executed in the nonvolaltile memory equivalent to the second embodiment of the invention.

Further, in reading, as shown in FIG. 8, when reference potential Vr is applied to the control gate of a transistor in the selected cell $C_{se}$ and fixed voltage is applied to the source line SL, the voltage is output as it is and the fixed voltage is detected because current hardly flows as described above when data is '1' and voltage drops to be low because current flows as described above when data is '0'. Therefore, both '1' and '0' can be identified and no malfunction is caused in an adjacent cell.

Figure 9A:
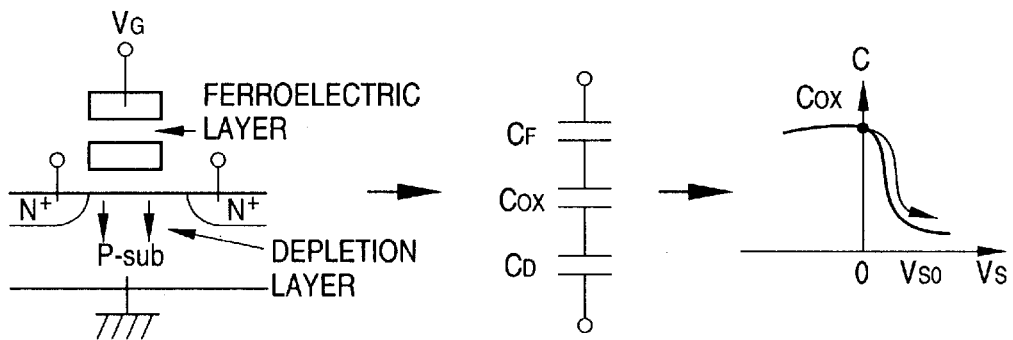
FIGS. 9A and 9B are explanatory drawings for explaining the principle of the invention.

That is, for a selected cell which is a writing cell, sufficient voltage VF is applied to the ferroelectric film, while for an adjacent cell, the source and the drain are made floating, a depletion layer spreads in the channel area of FET, voltage VF applied to the ferroelectrics is reduced by increasing the capacity of the depletion layer and wrong writing is prevented so that a state shown in FIG. 9A is realized.

Figure 9B:
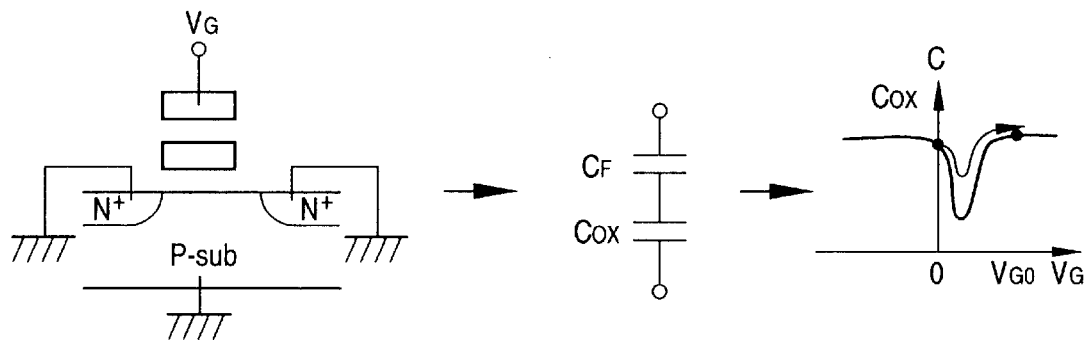
Figure 10:
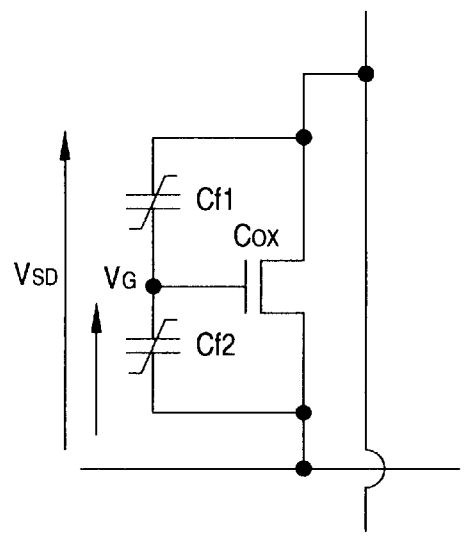
FIG. 10 shows a conventional type memory cell.
Figure 11:
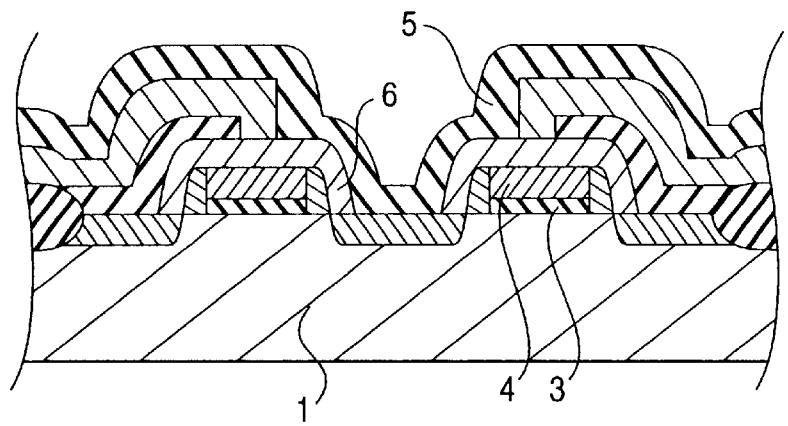
FIG. 11 shows the structure of a conventional type nonvolatile memory.
Figure 12:
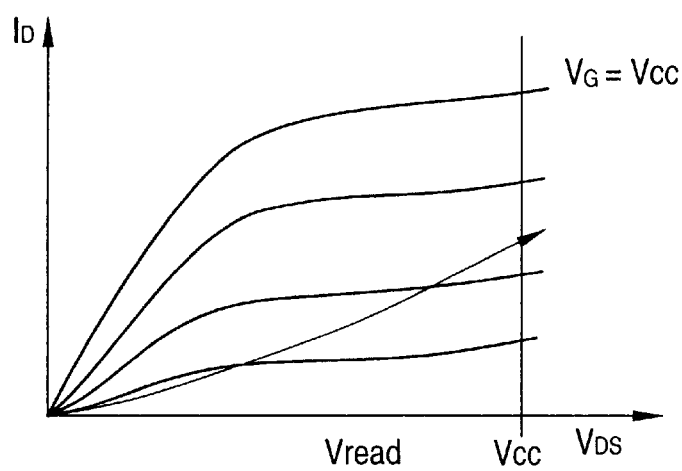
FIGS. 12A nd 12B show a state of a signal in case writing ('1') ('0') is executed to a selected cell of the conventional type nonvolatile memory.
Figure 12:
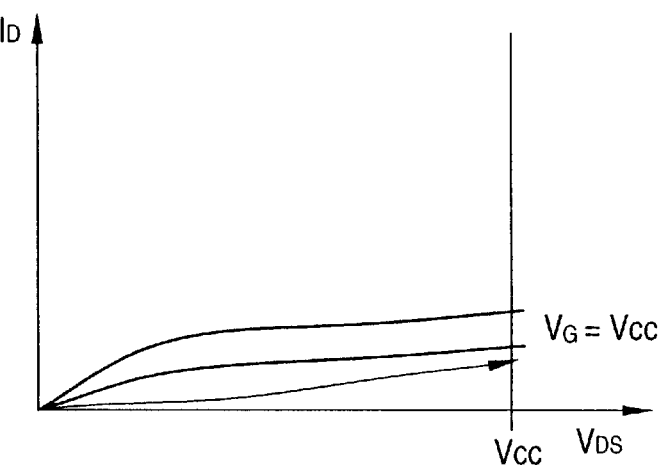
Figure 13:
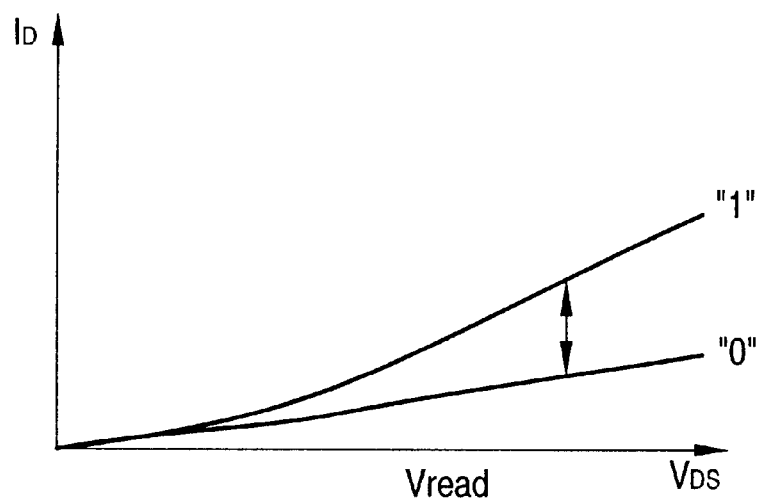
FIG. 13 shows a reading margin of the conventional type nonvolatile memory.
Figure 14:
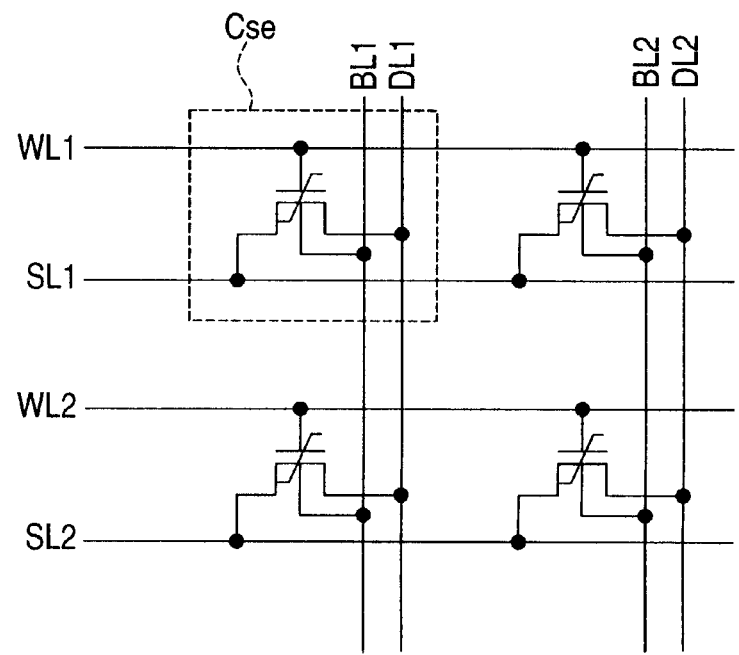
FIG. 14 shows an equivalent circuit of the conventional type nonvolatile memory.
Figure 15A:
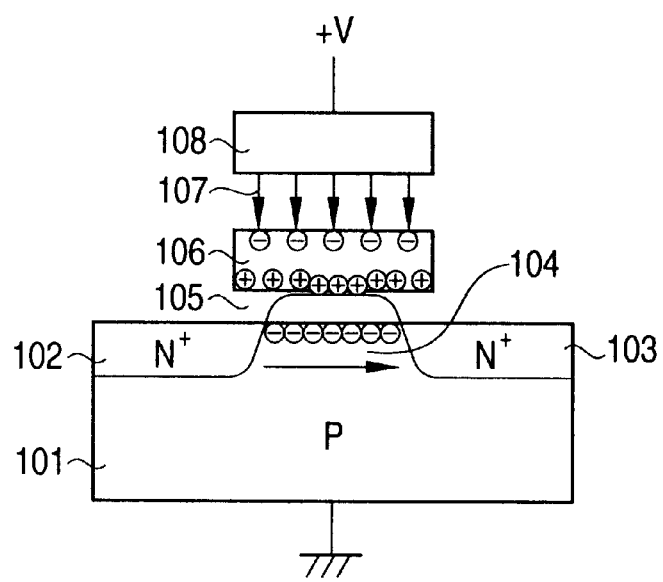
FIGS. 15A and 15B show the structure of the conventional type nonvolatile memory.
Figure 15B:
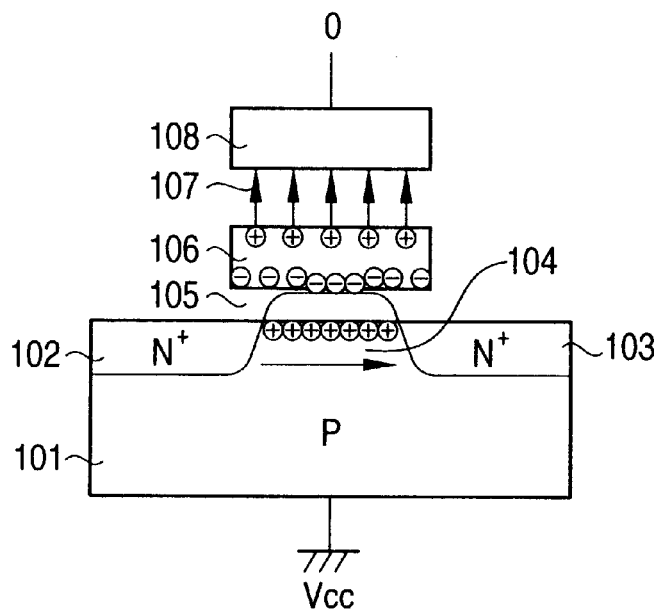
Figure 16:
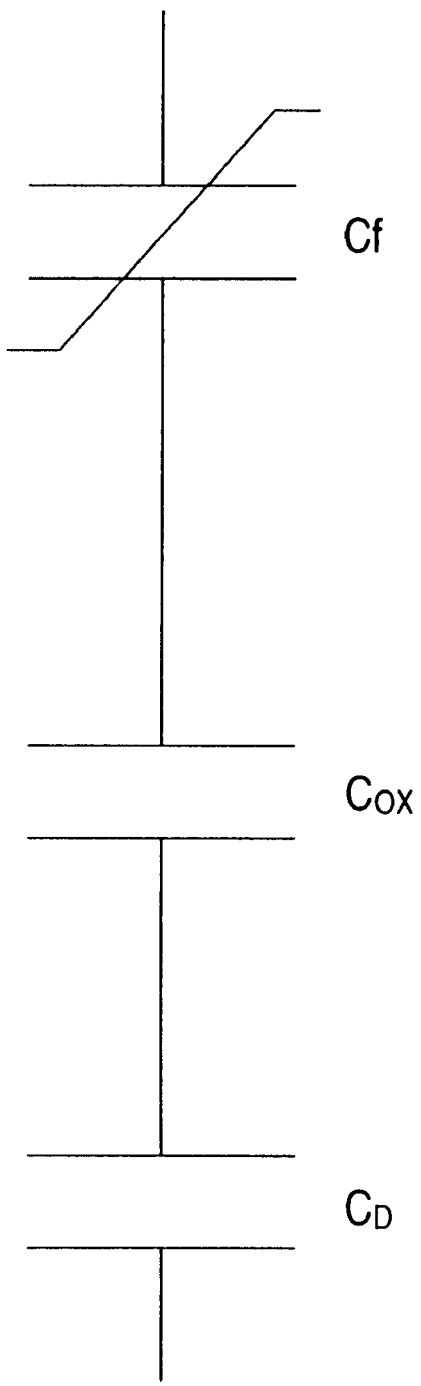
FIG. 16 shows an equivalent circuit of one cell of the conventional type nonvolatile memory.

Concretely, both potential at the source equivalent to the line of a selected cell and at the drain equivalent to the column is set to be except 0, all unselected cells are made a state shown in FIG. 9B, voltage applied to the ferroelectrics is reduced by potential applied to the selected cell and disturbance is prevented.

The case in which the memory transistor having MFMIS structure is used is described in the embodiment described above, however, the invention is not limited to the embodiment and it need scarcely be said that the invention can be also applied to a transistor having MFS structure.

According to the invention, a cell on a line and in a column respectively adjacent to a selected cell is prevented from being influenced and from being operated as if data was written to the adjacent cell though no data is actually written and reliable writing and reading are enabled.

Hereby, writing and reading data without a malfunction are enabled.

In the embodiment described above, potential at the source and the drain of an unselected cell has only to be selected so that both are not at ground potential and may be also floating or high.

As described above, according to the invention, the nonvolatile memory wherein reliable writing is enabled without writing to an unselected cell in the vicinity of a selected cell by mistake can be acquired.

What is claimed is:

1. A nonvolatile memory in which transistors having MFMIS structure each of which is composed by sequentially laminating a floating-gate, a ferroelectric layer and a control gate via a gate insulating film on the surface of a semiconductor substrate between a source area and a drain area formed on the semiconductor substrate are arrayed in a matrix, wherein:

said control gate is connected to a word line, said source area is connected to a source line and said drain area is connected to a drain line;

a floating line composed of writing gates composed so that a capacitor is formed between the writing gate and said floating-gate is provided;

a word line and a source line on the same line in said matrix are connected in common;

a drain line and a floating line in the same column in said matrix are connected in common; and source/drain voltage and gate voltage can be independently set.

2. A nonvolatile memory according to claim 1, wherein:

said memory cell comprises on the surface of a semiconductor substrate between a source area and a drain area formed on the surface of the semiconductor substrate:

FET having MFMIS structure provided with a gate insulating film, a floating-gate, a ferroelectric layer and a control gate respectively sequentially laminated; and a capacitor composed so that the control gate covers a writing gate formed on an element isolation insulating film via a capacitor insulating film.

3. A nonvolatile memory according to claim 2, wherein:

said writing gate is provided with an area close to said floating-gate and protruded in the direction of the floating-gate; and a capacitor is formed in an area in which the protruded area and the floating-gate are overlapped.

4. A nonvolatile memory according to claim 1, wherein:

said semiconductor substrate is separated every column so that voltage can be independently applied and is connected to a back gate line;

the potential of said source line and that of said drain line can be respectively set to floating potential or ground potential every line and column; and in writing data to a selected cell, a depletion layer spreads in the channel area of said ferroelectric transistor composing an unselected cell in the vicinity by keeping source/drain potential in the unselected cell in the vicinity of the selected cell a desired value and an inversion layer is prevented from being formed.

5. A nonvolatile memory, wherein:

one memory cell includes FET having MFMIS structure acquired by sequentially laminating a floating-gate, a ferroelectric layer and a control gate via a gate insulating film on the surface of said semiconductor substrate between a source area and a drain area respectively formed on the surface of the semiconductor substrate; and the floating-gate is extended on an element isolation insulating film, is provided with a capacitor insulating film between the floating-gate and a writing gate formed on the element isolation insulating film and composes a capacitor.

6. A nonvolatile memory in which ferroelectric transistors each of which is formed by laminating a gate electrode via at least a first ferroelectric layer on the surface of a semiconductor substrate between a source area and a drain area formed on the semiconductor substrate are arrayed in a matrix, wherein:

the gate electrode is connected to a word line, the source area is connected to a source line and the drain area is connected to a drain line;

the semiconductor substrate is separated every column so that voltage is independently applied and is connected to back gate line;

the potential of the source line and the potential of the drain line can be respectively set to floating potential or ground potential every line and column; and in writing data to a selected cell, a depletion layer spreads in the channel area of the ferroelectric transistor composing an unselected cell in the vicinity by keeping source/drain potential in the unselected cell in the vicinity of the selected cell a desired value and an inversion layer is prevented from being formed.

* * * * *